United States Patent
Yang et al.

(10) Patent No.: US 9,524,989 B2
(45) Date of Patent: Dec. 20, 2016

(54) ARRAY SUBSTRATE AND METHOD OF MANUFACTURING THE SAME, AND LIQUID CRYSTAL DISPLAY SCREEN

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Tong Yang, Beijing (CN); Guolei Wang, Beijing (CN)

(73) Assignees: BOE TECHNOLOGY GROUP CO., LTD., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 14/436,258

(22) PCT Filed: Aug. 12, 2014

(86) PCT No.: PCT/CN2014/084160
§ 371 (c)(1),
(2) Date: Apr. 16, 2015

(87) PCT Pub. No.: WO2015/149464
PCT Pub. Date: Oct. 8, 2015

(65) Prior Publication Data
US 2016/0148951 A1    May 26, 2016

(30) Foreign Application Priority Data
Apr. 4, 2014 (CN) .......................... 2014 1 0136950

(51) Int. Cl.
*H01L 27/12* (2006.01)
*H01L 27/32* (2006.01)
(Continued)

(52) U.S. Cl.
CPC ........... *H01L 27/124* (2013.01); *G02F 1/1368* (2013.01); *G02F 1/13439* (2013.01);
(Continued)

(58) Field of Classification Search
CPC combination set(s) only.
See application file for complete search history.

(56) References Cited

U.S. PATENT DOCUMENTS

2005/0208693 A1    9/2005 Youn et al.
2012/0273789 A1*  11/2012 Hui .................. G02F 1/136227
                                                                257/59

FOREIGN PATENT DOCUMENTS

CN    101334564 A    12/2008
CN    102445799 A    9/2012
(Continued)

OTHER PUBLICATIONS

International Search Report and Written Opinion in Chinese dated Dec. 11, 2014, for corresponding PCT Application No. PCT/CN2014/084160.
(Continued)

*Primary Examiner* — Ha Tran T Nguyen
*Assistant Examiner* — Aaron Dehne
(74) *Attorney, Agent, or Firm* — Kinney & Lange, P.A.

(57) ABSTRACT

Embodiments of the present invention disclose an array substrate and a method of manufacturing the same, and a liquid crystal display screen. The array substrate comprises gate lines, data lines arranged to intersect the gate lines, common electrode signal lines, and a plurality of pixels defined by the gate lines and the data lines, wherein each pixel comprises a drive transistor, a pixel electrode connected with one of a source electrode and a drain electrode of the drive transistor while the other one of the source electrode and the drain electrode of the drive transistor is
(Continued)

connected with the respective data line, and a common electrode electrically connected with the respective common electrode signal line, and, the common electrode signal lines and the gate lines are formed in the same layer and extend in the same direction as the gate lines, wherein each pixel further comprises a common electrode connection line formed in the same layer as the respective common electrode signal line and extending in a direction of the respective data line, and the common electrode connection line is electrically connected with the respective common electrode signal line and the respective common electrode. Embodiments of the present invention is made so that the pixel resistance value is reduced, reducing the phenomenon of partial green picture in the liquid crystal display screen as a whole.

11 Claims, 9 Drawing Sheets

(51) Int. Cl.
*G02F 1/1343* (2006.01)
*G02F 1/1362* (2006.01)
*G02F 1/1368* (2006.01)

(52) U.S. Cl.
CPC .. *G02F 1/134363* (2013.01); *G02F 1/136286* (2013.01); *H01L 27/1259* (2013.01); *H01L 27/3297* (2013.01); *G02F 2001/134372* (2013.01); *G02F 2001/136295* (2013.01)

(56) References Cited

FOREIGN PATENT DOCUMENTS

| CN | 103018993 A | 4/2013 |
|---|---|---|
| CN | 203025451 U | 6/2013 |
| CN | 203117619 U | 8/2013 |
| CN | 103913916 A | 7/2014 |
| CN | 203909443 U | 10/2014 |

OTHER PUBLICATIONS

First Chinese Office Action dated Dec. 28, 2015, for corresponding Chinese Application No. 201410136950.7.
Written Opinion and English translation of Box V dated Dec. 11, 2014, for corresponding PCT Application No. PCT/CN2014/084160.
Second Chinese Office Action dated May 19, 2016, for corresponding Chinese Application No. 201410136950.7.

* cited by examiner

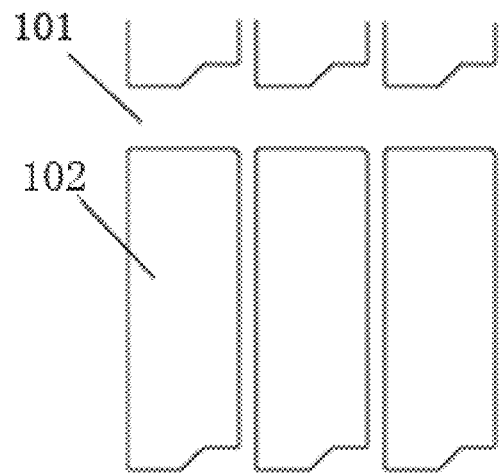
Figure 2（a）
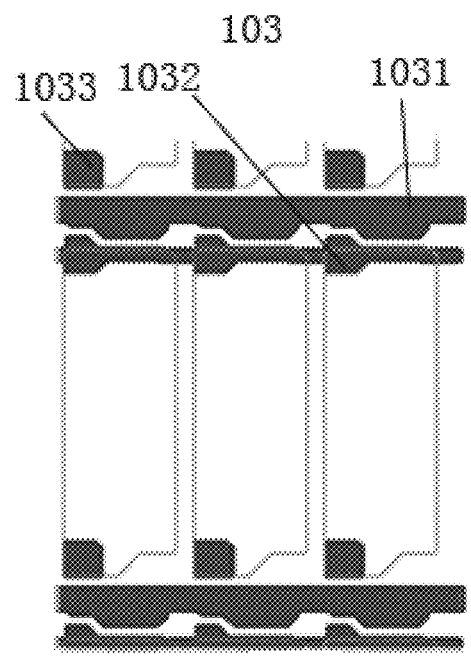
Figure 2（b） depositing a common electrode layer on a substrate 201, and etching the common electrode layer to form a plurality of strip common electrodes 202 arranged in an array

↓ depositing a gate layer 203 on the substrate 201 formed with the common electrodes 202, and etching the gate layer 203 to form a gate line 2031 between upper and lower rows of pixel units, a common electrode signal line 2032 located in a horizontal direction above the common electrode 202 for a row of pixel units, a first through-hole region 2033 located leftward below each common electrode 202, and a common electrode connection line 2034 between the common electrode signal line 2032 located above one common electrode 202 and the first through-hole region 2033 located leftward below the same one common electrode 202

↓ depositing an insulating layer after etching the gate layer, and depositing in order on the insulating layer and etching a layer of active material and source-drain electrodes 204, a passivation layer 205 and a pixel electrode layer 206, so as to form a plurality of drive thin film transistors, data lines 2044, first through-holes 2051, second through-holes 2052, third through-holes 2053, pixel electrodes 2061 and jumpers 2062

Figure 5 depositing a common electrode layer on a substrate 201, and etching the common electrode layer to form a plurality of strip common electrodes 202 arranged in an array depositing a gate layer 203 on the substrate 201 formed with the common electrodes 202, and etching the gate layer 203 to form a gate line 2031 between upper and lower rows of pixel units, a common electrode signal line 2032 located in a horizontal direction above the common electrode 202 for a row of pixel units, a first through-hole region 2033 located leftward below each common electrode 202, and a common electrode connection line 2034 between the common electrode signal line 2032 located above one common electrode 202 and the first through-hole region 2033 located leftward below the same one common electrode 202 depositing an insulating layer after etching the gate layer, and depositing in order on the insulating layer and etching a layer of active material and source-drain electrodes 204, and a passivation layer 205 so as to form a plurality of drive thin film transistors, data lines 2044, first through-holes 2051, second through-holes 2052 and third through-holes 2053 depositing a conductive layer on the passivation layer 205, and etching the conductive layer to form a first layer of jumper, the first layer of jumper being located between the first through-hole 2051 and the second through-hole 2052, and connecting the first through-hole region 2033 and the common electrode signal line 2032 via the first through-hole 2051 and the second through-hole 2052 depositing and etching a pixel electrode layer 206 to form a plurality of pixel electrodes 2061 and a second layer of jumper. The second layer of jumper is completely overlapped with the first layer of jumper so as to form the double-layer jumper 301

Figure 6

ARRAY SUBSTRATE AND METHOD OF MANUFACTURING THE SAME, AND LIQUID CRYSTAL DISPLAY SCREEN

BACKGROUND OF THE INVENTION

Field of the Invention

The present invention relates to the field of display technologies, and particularly, to an array substrate based on an Advanced-Super Dimensional Switching (AD-SDS) mode and a method of manufacturing the same, and a liquid crystal display screen.

Description of the Related Art

An Advanced-Super Dimensional Switching (AD-SDS) technology is a core technology for a plane electric field and a wide angle of view, where a multi-dimensional electric field is formed by parallel electric fields generated at edges of pixel electrodes within a same one plane and longitudinal electric fields generated between pixel electrode layers and common electrodes, so that all liquid crystal molecules which are located in various orientations between the pixel electrodes and directly above the electrodes within a liquid crystal cell can be rotated and deflected, thereby improving working efficiency of liquid crystals in a plane orientation system and increasing light transmission efficiency. The Advanced-Super Dimensional Switching technology can improve quality of a picture displayed by a TFT-LCD (thin film transistor-liquid crystal display) screen, and has advantages such as a high light transmittance, a wide angle of view, a high aperture ratio, low color shift, a low response time, no squeezed water ripple and the like.

A common electrode is always required for operations of the TFT liquid crystal display screen based on the AD-SDS display mode. For a TFT liquid crystal display screen where the common electrode is supplied with a direct current level, a voltage on the common electrode keeps in a stable level under an ideal state. In a practice display operation, however, since signals on gate lines and data lines change, the voltage on the common electrode will be often affected by coupling capacitances between the common electrode and the gate lines and the data lines, and thus cannot be maintained in a stable level. In case of a smaller sized display screen, the common electrode has a smaller size and has smaller overlapped areas with the gate lines and the data signal lines, thus the common electrode has a lower resistance value and a smaller parasitic capacitance value, and an impact to the potential of the common electrode is also smaller, thereby the voltage of the common electrode can be maintained better and has a good uniformity in the entire panel.

FIG. 1 shows a schematic structural diagram of a TFT liquid crystal display screen in the prior art, and FIG. 2(a)~FIG. 2(e) show flowcharts of processes of manufacturing the TFT liquid crystal display screen in prior art. As shown in FIGS. 1 and 2, the TFT liquid crystal display screen comprises: a substrate 101, a common electrode 102, a gate layer 103, an layer of active material and source-drain electrodes 104, a passivation layer 105, and a pixel electrode 106. As can be seen from FIG. 2(b), through etching processes, the gate layer 103 is formed with a gate line 1031, a common electrode signal line 1032 above the common electrode and a through-hole region 1033 below the common electrode. A common electrode signal, after being inputting from an external input point, is transmitted through the common electrode signal line 1032 in a horizontal direction between pixel units in the horizontal direction, and is transmitted in a vertical direction, that is, between upper and lower pixel units, to the through-hole region 1033 below the common electrode through ITO material of the common electrode 102, and then is transmitted to a next row of pixel units through a jumper connecting the through-hole region 1033 and a next row of common electrode signal lines. The ITO material is usually selected for the common electrode 102, a sheet resistance of the ITO, however, is generally several hundreds of times of that of a metal layer. Since the common electrode signal line 1032 between common electrodes for a plurality of pixel units in the horizontal direction is formed from the gate layer 103, which is usually composed of a metal material, the resistance value of the common electrode in the horizontal direction, that is, a resistance value of the common electrode signal line between common electrodes for the plurality of pixel units in the horizontal direction, is much less than that of the common electrode signal line in the vertical direction, that is, between the common electrode signal line and the through-hole region. A voltage signal of a common electrode is transmitted through the common electrode signal line in horizontal direction, and through the common electrode in the vertical direction to the through-hole region, the common electrode signal transmitted to the through-hole region is transmitted to the common electrode signal line of a pixel unit therebelow through a jumper, which is used to connect the through-hole region and the common electrode signal line of the pixel unit therebelow, and which is composed of a pixel electrode layer, that is, a ITO layer. Thus, when the liquid crystal display screen has a larger size, the common electrode has a larger size and has a larger overlapped area with the gate lines and the data signal lines, thus the total impact to the common electrode is greater, and due to the larger size, the voltage of the common electrode far away from the input point for inputting the common electrode signal is not easy to be recovered after being impacted, which will result in a deflection voltage for liquid crystals of pixels, causing a difference in displayed color. Further, since human eyes are more sensitive to green color, some displayed patterns, when viewed by the human eyes, are pictures which are partial green on the display screen as a whole. Therefore, there is a need to reduce the resistance value of the common electrode in order to reduce the phenomenon of the partial green picture.

SUMMARY OF THE INVENTION

A problem to be solved by embodiments of the present invention is how to reduce the resistance value of the common electrode so as to avoid the phenomenon of the partial green picture of the liquid crystal display screen as a whole.

According to an aspect of the present invention, there is provided an array substrate, comprising gate lines, data lines arranged to intersect the gate lines, common electrode signal lines, and a plurality of pixels defined by the gate lines and the data lines, wherein each pixel comprises a drive transistor, a pixel electrode connected with one of a source electrode and a drain electrode of the drive transistor while the other one of the source electrode and the drain electrode of the drive transistor is connected with the respective data line, and a common electrode electrically connected with the respective common electrode signal line, and, the common electrode signal lines and the gate lines are formed in the same layer and extend in the same direction as the gate lines, wherein each pixel further comprises a common electrode connection line formed in the same layer as the respective common electrode signal line and extending in a direction of the respective data line, and the common electrode connection line is electrically connected with the respective common electrode signal line and the respective common electrode.

Optionally, the common electrode connection line is connected, via a through-hole and a jumper, to a common electrode signal line for a next row of pixel units.

Optionally, the jumper and the pixel electrode are formed of the same material in the same layer.

Optionally, the jumper is formed by stacking an auxiliary conductive layer and a layer where the pixel electrode is located.

Optionally, the gate lines are made of metal materials or metal compound materials.

Optionally, the gate lines are made of one of or any combination of neodymium aluminum, aluminum, copper, molybdenum, tungsten molybdenum and chromium.

Optionally, the common electrode and the pixel electrode layer are made of one of indium zinc oxide and indium tin oxide or a combination of indium zinc oxide and indium tin oxide.

Optionally, the conductive layer is a metal layer, or a conductive layer of low resistivity.

According to a second aspect of the present invention, there is provided a liquid crystal display screen comprising the abovementioned array substrate.

According to a third aspect of the present invention, there is provided a method of manufacturing an array substrate, and the method comprises:

forming a plurality of common electrodes on a substrate;

depositing a gate layer on the substrate formed with the common electrodes, and etching the gate layer to form a gate pattern, wherein the gate pattern comprises gate lines, common electrode signal lines and common electrode connection lines, wherein the common electrode signal lines and the gate lines extend in the same direction, and, the common electrode connection lines, the common electrode signal lines and the common electrodes are electrically connected with one another; and depositing in order and correspondingly etching an active layer, a source-drain electrode layer, a passivation layer and a pixel electrode layer so as to form a plurality of drive transistors, data lines intersecting the gate lines, a plurality of pixel electrodes each of which is connected with one of a source electrode and a drain electrode of the respective drive transistor; the other one of the source electrode and the drain electrode of the drive transistor is connected with the respective data line;

wherein the plurality of drive transistors, the plurality of pixel electrodes and the plurality of common electrodes compose a plurality of pixels, and the common electrode connection lines extend in a direction of the data lines.

According to a fourth aspect of the present invention, there is provided a method of manufacturing an array substrate, and the method comprises:

forming common electrodes on a substrate;

depositing a gate layer on the substrate formed with the common electrodes, and etching the gate layer to form a gate pattern, wherein the gate pattern comprises gate lines, common electrode signal lines and common electrode connection lines; wherein the common electrode signal lines and the gate lines extend in the same direction, and, the common electrode connection lines, the common electrode signal lines and the common electrodes are electrically connected with one another; and depositing in order and correspondingly etching an active layer, a source-drain electrode layer and a passivation layer so as to form a plurality of drive transistors and data lines intersecting the gate lines, one of a source electrode and a drain electrode of each drive transistor being connected with the respective data line;

depositing and etching a conductive layer to form a first layer of jumper connecting the through-hole region and a common electrode signal line corresponding to a next row of pixel units;

depositing and etching a pixel electrode layer to form a pixel electrode layer pattern, wherein the pixel electrode layer pattern comprises a second layer of jumper completely overlapped with the first layer of jumper, and a plurality of pixel electrodes each of which is connected with the other one of the source electrode and the drain electrode of the respective drive transistor;

wherein the plurality of drive transistors, the plurality of pixel electrodes and the plurality of common electrodes compose a plurality of pixels, and the common electrode connection lines extend in a direction of the data lines.

In each pixel unit of the liquid crystal display screen provided by embodiments of the present invention, the upper common electrode signal line is connected, through the gate layer, with the through-hole region electrically connected with the lower common electrode signal line, so that the resistance value between upper and lower pixel units is reduced. Further, in each pixel unit of the liquid crystal display screen provided by embodiments of the present invention, a conductive layer is added within a region of the jumper between the through-hole region electrically connected with the lower common electrode signal line and the lower common electrode signal line, so as to further reduce the resistance value between the upper and lower common electrode signal lines. For the liquid crystal display screen of any sizes, due to reducing of the resistance value between upper and lower pixel units, a voltage of the common electrode located far away from the external common electrode signal, after affection by the gate lines and the data lines, can be supplemented in time, and thus can be restored to a normal common electrode voltage, and the deflection voltage of the pixel liquid crystals won't be easily shifted away from the desired value, reducing the phenomenon of tinted green picture in the liquid crystal display screen as a whole. The liquid crystal display screen provided by the first embodiment of the present invention is especially suitable for these small and medium sized liquid crystal display screens, while the liquid crystal display screen provided by the second embodiment is especially suitable for these medium and large sized liquid crystal display screens.

BRIEF DESCRIPTION OF THE DRAWINGS

FIG. 5 is a flowchart of a method of manufacturing the array substrate provided in the first embodiment of the present invention; and FIG. 6 is a flowchart of a method of manufacturing the array substrate provided in the second embodiment of the present invention.

DETAILED DESCRIPTION OF PREFERRED EMBODIMENTS OF THE INVENTION

Figure 1:
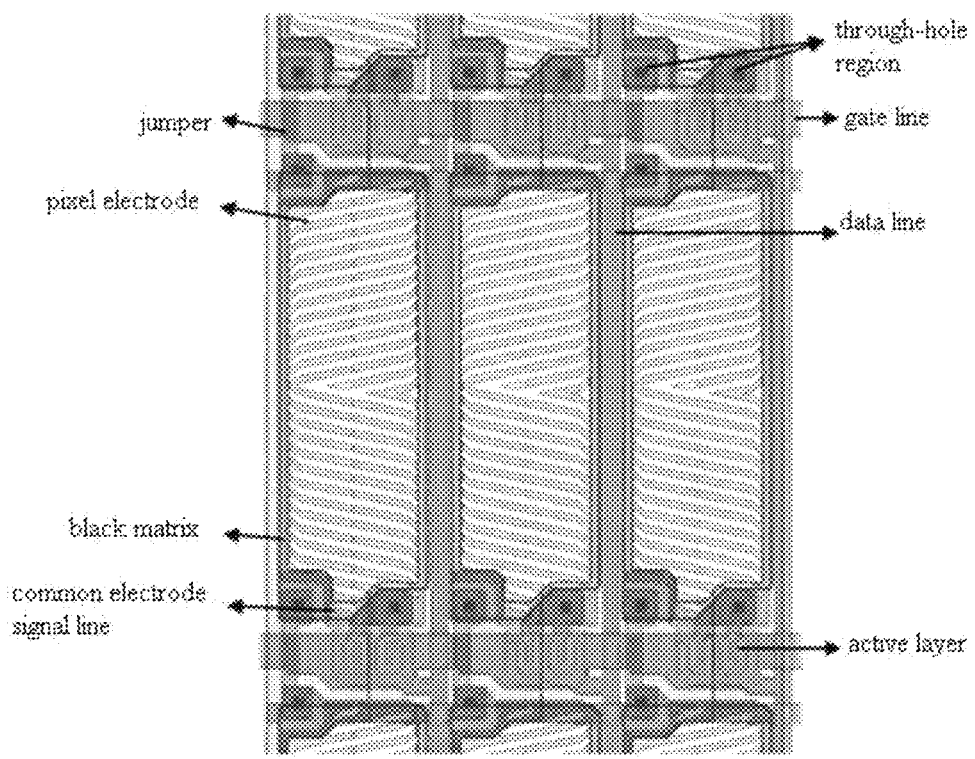
FIG. 1 shows a schematic structural diagram of a TFT liquid crystal display screen in the prior art.
Figure 2:
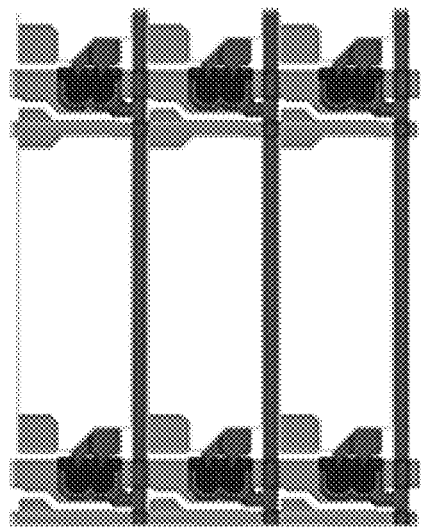
FIG. 2(a)~FIG. 2(e) show flowcharts of processes of manufacturing the TFT liquid crystal display screen in prior the art.
Figure 2:
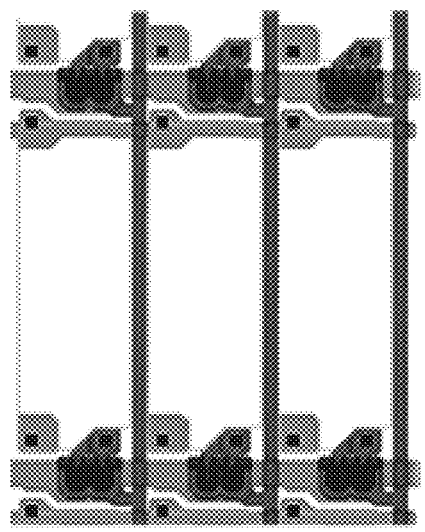
Figure 2:
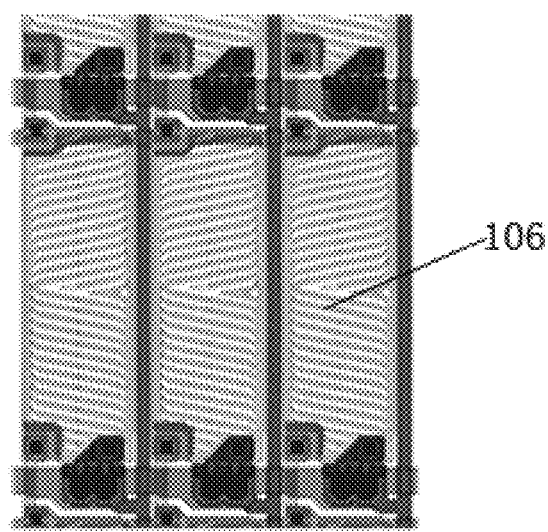

In order to provide a more clear understanding of objects, technique solutions and advantages of the present invention, the present invention will be further described hereinafter in detail in conjunction with preferred embodiments and with reference to the attached drawings.

FIG. 3(a)~FIG. 3(e) show plan views of a structure of, and flowcharts of processes of manufacturing, an array substrate in a first embodiment of the present invention. As shown in FIG. 3(a)~FIG. 3(e), the array substrate, in its cross-sectional configuration, comprises a substrate 201, common electrodes 202, a gate layer 203, a layer of active material and source-drain electrodes 204, a passivation layer 205 and a pixel electrode layer 206. As shown in FIG. 3(a), the common electrodes 202 are arranged on the substrate 201 in an array manner. As shown in FIG. 3(b), the gate layer 203 covers on the substrate 201 formed with the common electrodes 202, and as can be seen from FIG. 3(b), the gate layer 203 is etched to form gate lines 2031, common electrode signal lines 2032 above the common electrodes, and first through-hole regions 2033 below the common electrode, each common electrode signal line 2032 is used to connect the common electrodes for the same row of pixel units. A common electrode connection line 2034 formed from the gate layer 203 is between the common electrode signal line 2032 and the first through-hole region 2033 respectively above and below the common electrode 202 for each pixel unit.

The layer of active material and source-drain electrodes 204 forms U-shaped active channels 2041, source electrodes 2042, drain electrodes 2043 and data lines 2044 of drive transistors, the data lines 2044 and the gate lines 2031 are arranged to be intersected with each other so as to define a plurality of pixel units. Each pixel unit includes therewithin a drive transistor, a pixel electrode 2061 and a common electrode 202 electrically connected with the common electrode signal line 2032. The pixel electrode 2061 is formed by etching the pixel electrode layer 206, one of the source electrode 2042 and the drain electrode 2043 of the drive transistor is connected with the data line 2044, and the other one is connected with the pixel electrode 2061. The common electrode connection line 2034 extends in a direction of the data line 2044.

Optionally, the substrate 201 is made of a material such as glass, quartz, transparent resin or the like.

Optionally, the common electrode 202 is made of indium tin oxide (ITO) or indium zinc oxide (IZO) material, and includes a plurality of strip common electrodes 202, which are formed by depositing a layer of ITO or IZO on the substrate 201 to form a common electrode layer and by etching the common electrode layer and are arranged in an array, as shown in FIG. 3(a). Optionally, the common electrode 202 may be also made of a composite material composed of ITO and IZO.

Optionally, the gate layer 203 is made of a metal material, may be made of one metal material or may be made of a composite material composed of several metal materials. Optionally, the gate layer 203 may be made of one of, or a composite material composed of more of, neodymium aluminum (AlNd), aluminum (Al), copper (Cu), molybdenum (Mo), tungsten molybdenum (MoW) and chromium (Cr).

The gate layer 203 is deposited on the substrate 201 formed with the common electrodes 202, and is etched, after the depositing, so as to form a gate line 2031 between the common electrodes 202 for upper and lower rows of pixel units, a common electrode signal line 2032 located in a horizontal direction above the common electrode 202 for a row of pixel units and connecting the common electrodes for the same row of pixel units, a first through-hole region 2033 located leftward below each common electrode 202, and a common electrode connection line 2034 between the common electrode signal line 2032 located above one common electrode 202 and the first through-hole region 2033 located leftward below the same one common electrode 202, as shown in FIG. 3(b). The common electrode signal line 2032 and the gate line 2031 extend in the same direction.

Optionally, the common electrode connection line 2034 may be a narrow line overlapped at a left edge of the common electrode 202 so as to reduce or not impair magnitude of the pixel aperture ratio. A line width of the line may be the minimum allowable line width in process, and specifically be associated with process capability.

Since there is no insulating layer between the common electrode 202 and the gate layer 203, the common electrode 202 is electrically connected with the common electrode signal line 2032, the first through-hole region 2033 and the common electrode connection line 2034 formed from the gate layer 203.

In embodiments of the present invention, the common electrode signal line 2032 is connected to the first through-hole region 2033 below the common electrode 202 through the gate layer 203, and the first through-hole region 2033 will be connected to the common electrode signal line for the next row of pixel units through the jumper. In this way, since the gate layer 203 is made of a metal material, embodiments of the present invention can reduce the resistance value of the common electrode 202 in the vertical direction, so that the resistance value of the common electrode in the horizontal direction reaches equilibrium with that of the common electrode in the vertical direction, and the phenomenon of partial green in the whole screen can be avoided. Further, since, in embodiments of the present invention, the common electrode signal line 2032 is connected to the first through-hole region 2033 below the common electrode 202 through the gate layer 203, no additional process step is required for manufacturing the array substrate, and production cycle and cost of the display screen will be little affected.

Optionally, the layer of active material and source-drain electrodes 204 is formed over the gate layer 203. Specifically, an insulating layer is firstly formed over the gate layer 203, an active material layer is then deposited on the insulating layer, and a source-drain material layer is deposited, so that the layer of active material and source-drain electrodes 204 is formed. The layer of active material and source-drain electrodes is a composite layer of the active layer and these source and drain electrodes. The active layer may be made of a-Si, poly-silicon or IGZO, and the source-drain electrode layer may be made of one or more layers of metal, such as Mo/Al/Mo, Mo/Cu/Mo, Mo or the like.

The layer of active material and source-drain electrodes 204, after being formed, is etched to form a U-shaped channel 2041, a source electrode 2042, a drain electrode 2043 and a data line 2044 of a thin film transistor TFT, wherein the data line 2044 is arranged to intersect the gate line 2031 and is connected with one of the source electrode 2042 and the drain electrode 2043 of the drive transistor. The specific processes are described as follows.

Photoresist is coated on the layer of active material and source-drain electrodes 204, and then is exposed through a mask plate, a region of which corresponding to the U-shaped channel of the thin film transistor TFT is partially transparent, a region of which corresponding to a source-drain pattern is opaque, and other parts having no source-drain pattern is fully transparent, so that a part of the photoresist within the region of the U-shaped channel is partially exposed, and other parts of the photoresist within the region having no source-drain pattern are fully exposed. After developing the photoresist, all the part of the photoresist on the source-drain pattern is present, the part of the photoresist on the U-shaped channel pattern is partially present, and other parts of the photoresist are fully absent. In a next etching process, materials of the layer of active material and source-drain electrodes within regions except for the source-drain pattern and the U-shaped channel, are completely etched off, then the part of the photoresist on the U-shaped channel is ashed off through an ashing process, and parts of the source-drain electrode layer and heavily doped active layer on the U-shaped channel are etched off, thereby forming the U-shaped channel 2041, the TFT source electrode 2042, the drain electrode 2043 and the data line 2044. Optionally, the active channel 2041 is stacked on the gate line 2031, the source electrode 2041 is located rightward below the common electrode 202 and is not overlapped with the common electrode 202, and the source electrode 2041 is connected to the U-shaped channel 2041. The drain electrode 2043 is located at a position corresponding to a part of the data line 2044 overlapped with the gate line 2031. The data line 2044 is located between the common electrodes 202 of two columns of pixel units, and the TFT drain electrode 2043 of each pixel unit is connected to the data line 2044, as shown in FIG. 3(c).

Optionally, the passivation layer 205 is made of an insulation material. Specifically, after etching the layer of active material and source-drain electrodes 204, a layer of insulation material is deposited over the layer of active material and source-drain electrodes 204 to form the passivation layer 205. Then, the passivation layer is etched so as to form therein three different through-holes including a first through-hole 2051, a second through-hole 2052 and a third through-hole 2053, as shown in FIG. 3(d). The first through-hole 2051 is located above the first through-hole region 2033, and has a shape of a small aperture formed by etching the passivation layer 205 so that the first through-hole region 2033 can be exposed from the small aperture. The second through-hole 2052 and the third through-hole 2053 are respectively located above the common electrode signal line 2032 and the TFT source 2042 and are formed by the same processes as the first through-hole 2051.

The first through-hole 2051 and the second through-hole 2052, after being connected to each other via the pixel electrode layer 206, are used to connect the common electrode of a previous row of pixel units and the common electrode of a next row of pixel electrodes; and, the third through-hole 2053 is used to connect the TFT source and the pixel electrode.

Optionally, the pixel electrode layer 206 is made of the same material, such as indium tin oxide (ITO) or indium zinc oxide (IZO), or a composite material composed of ITO and IZO, as the common electrode 202.

Optionally, the pixel electrode layer 206, after being deposited on the passivation layer 205, is etched to form a pixel electrode 2061 and a jumper 2062. The pixel electrode 2061 is located above the common electrode 202, and is only positioned within a region of the common electrode 202 where the common electrode signal line 2032, the first through-hole region 2033 and the common electrode connection line 2034 are not located. The jumper 2062 is located between the first through-hole 2051 and the second through-hole 2052, and connects the first through-hole region 2033 and the common electrode signal line 2032 via the first through-hole 2051 and the second through-hole 2052, as shown in FIG. 3(e). The pixel electrode 2061 is connected to the other one of the source electrode 2042 and the drain electrode 2043 of the thin film transistor as the drive transistor.

Each of the pixel units comprises a plurality of pixels composed of the drive transistor, a plurality of the pixel electrodes 2061 and a plurality of the common electrodes 202, and the common electrode connection line 2034 extends in the direction of the data line 2044.

Figure 4:
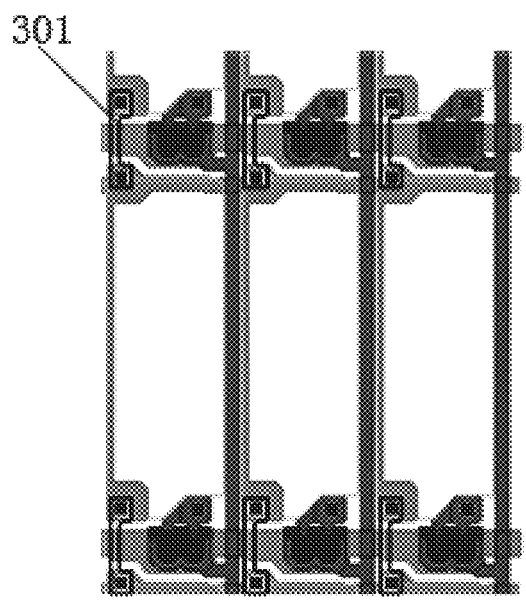
FIG. 4 shows a plan view of a structure of an array substrate in a second embodiment of the present invention.

A second embodiment of the present invention provides another array substrate, as shown in FIG. 4, which is different from the liquid crystal display screen of the first embodiment in that the jumper is a double-layer jumper 301 formed by a conductive layer and the pixel electrode layer 206. In this embodiment, the conductive layer is located below the pixel electrode layer 206.

The conductive layer may be made of a conductive layer of low resistivity or a metal layer, and preferably, be made of a metal layer.

Specifically, after depositing the passivation layer 205 and forming the three through-holes therein, a conductive layer is deposited and etched to form a first layer of jumper. The first layer of jumper is located between the first through-hole 2051 and the second through-hole 2052, and connects the first through-hole region 2033 and the common electrode signal line 2032 via the first through-hole 2051 and the second through-hole 2052. Then, the pixel electrode layer 206 is deposited and etched to form the pixel electrode 2061 and a second layer of jumper. The second layer of jumper is completely overlapped with the first layer of jumper so as to form the double-layer jumper 301.

As described above, as shown in FIGS. 3(a)~3(e), the array substrate, in its whole configuration, comprises: gate lines 2031, data lines 2044 arranged to intersect the gate lines 2031, common electrode signal lines 2032, and a plurality of pixels defined by the gate lines 2031 and the data lines 2044, wherein each pixel comprises therewithin a drive transistor, a pixel electrode 2061 connected with one of a source electrode 2042 and a drain electrode 2043 of the drive transistor while the other one of the source electrode 2042 and the drain electrode 2043 of the drive transistor is connected with the data line 2044, and a common electrode 202 electrically connected with the common electrode signal line 2032, and, the common electrode signal lines 2032 and the gate lines 2031 are formed in the same layer and extend in the same direction as the gate lines 2031, wherein each pixel further comprises therewithin a common electrode connection line 2034 formed in the same layer as the common electrode signal line 2032 and extending in a direction of the data line 2044, and the common electrode connection line 2034 is electrically connected with the common electrode signal line 2032 and the common electrode 202.

Figure 3:
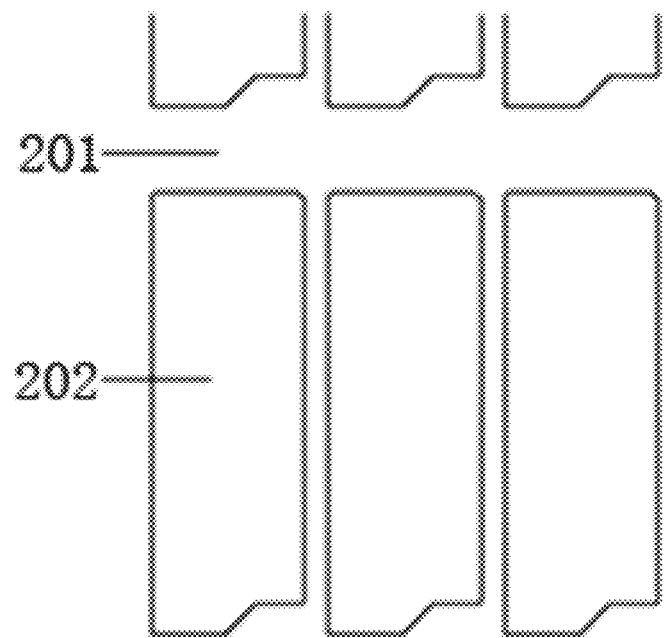
FIG. 3(a)~FIG. 3(e) show plan views of a structure of, and flowcharts of processes of manufacturing, an array substrate in a first embodiment of the present invention.
Figure 3:
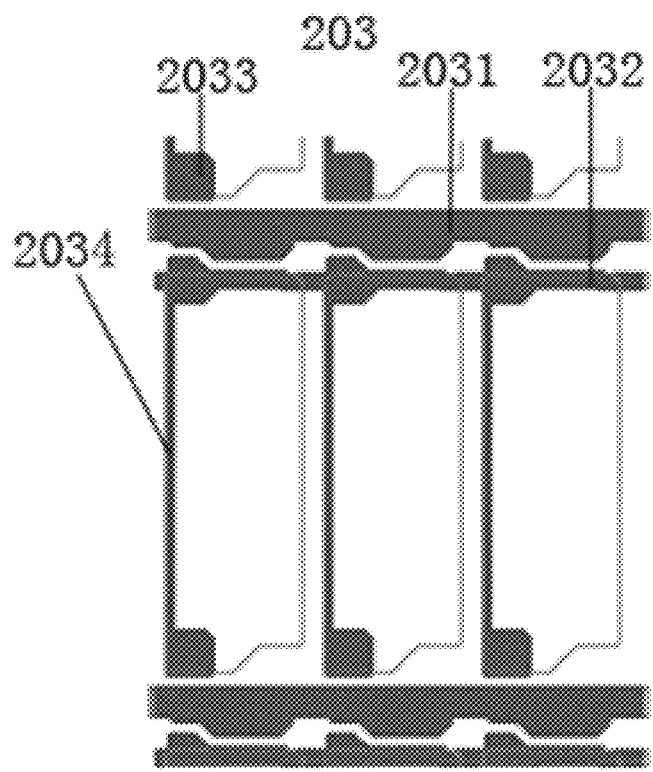
Figure 3:
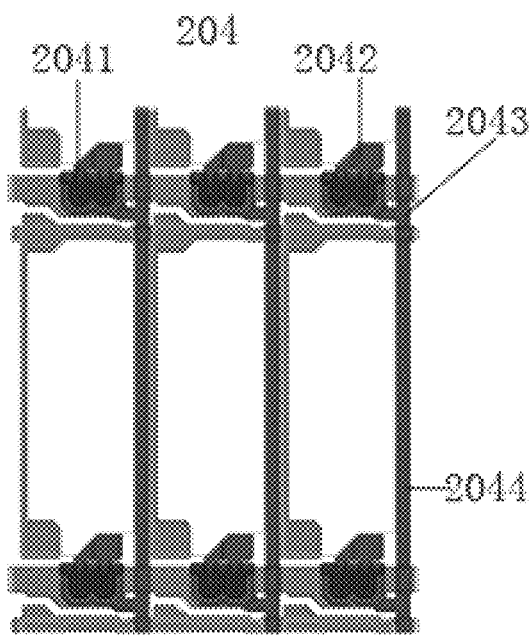
Figure 3:
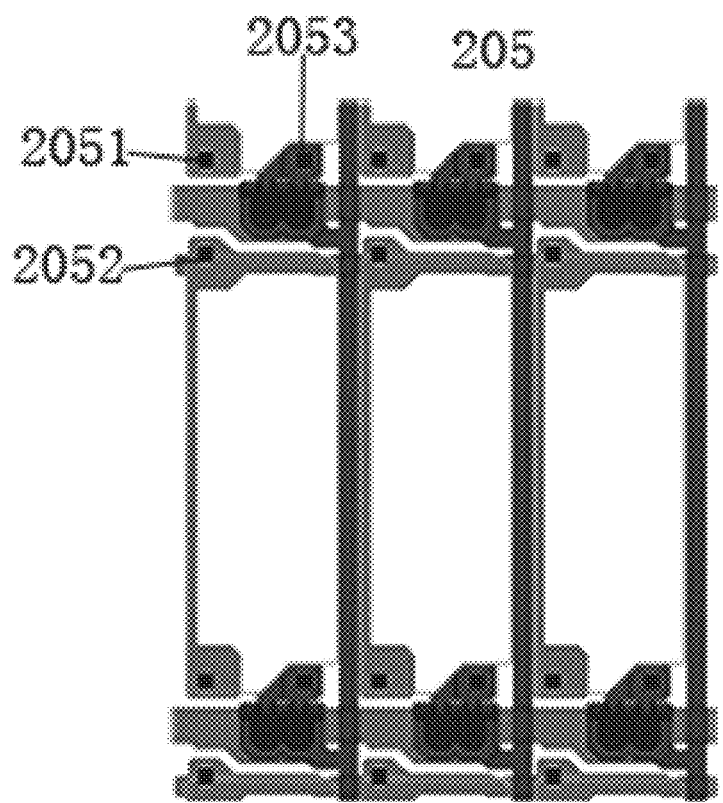
Figure 3:
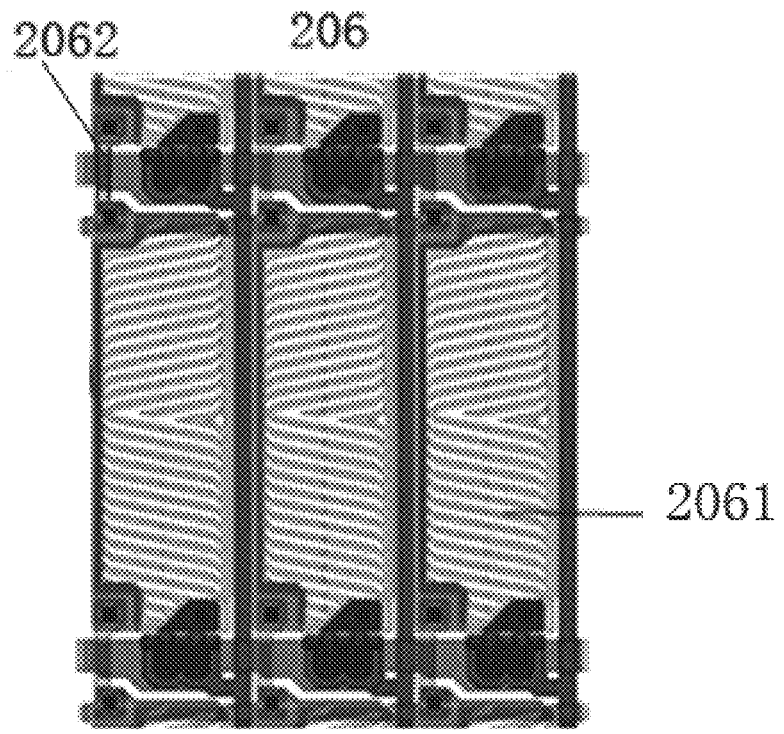

FIG. 5 shows a method of manufacturing the array substrate provided in the first embodiment of the present invention. As shown in FIGS. 3 and 5, the method comprises steps of:

depositing a common electrode layer on a substrate 201, and etching the common electrode layer to form a plurality of strip common electrodes 202 arranged in an array;

depositing a gate layer 203 on the substrate 201 formed with the common electrodes 202, and etching the gate layer 203 to form a gate line 2031 between upper and lower rows of pixel units, a common electrode signal line 2032 located in a horizontal direction above the common electrode 202 for a row of pixel units, a first through-hole region 2033 located leftward below each common electrode 202, and a common electrode connection line 2034 between the common electrode signal line 2032 located above one common electrode 202 and the first through-hole region 2033 located leftward below the same one common electrode 202; wherein the common electrode signal line 2032 and the gate line 2031 extend in the same direction, and the common electrode connection line 2034, the common electrode signal line 2032 and the common electrode 202 are electrically connected to one another; and depositing an insulating layer after etching the gate layer, and depositing in order on the insulating layer and etching a layer of active material and source-drain electrodes 204, a passivation layer 205 and a pixel electrode layer 206, so as to form a plurality of drive thin film transistors, data lines 2044, first through-holes 2051, second through-holes 2052, third through-holes 2053, pixel electrodes 2061 and jumpers 2062; wherein the drive transistor comprises an active channel 2041, a TFT source electrode 2042 and a drain electrode 2043, one of the source electrode 2042 and the drain electrode 2043 of the drive thin film transistor is connected with the pixel electrode 2061, and the other one of the source electrode 2042 and drain electrode 2043 of the drive transistor is connected with the data line 2044, and the data lines 2044 are arranged to intersect the gate lines 2031;

wherein the plurality of drive transistors, the plurality of pixel electrodes 2061 and the plurality of common electrode 202 compose a plurality of pixels, and the common electrode connection lines 2034 extend in the direction of the data lines 2044.

The abovementioned method is used to manufacture the array substrate provided in the first embodiment, and corresponds to the array substrate provided in the first embodiment in detail, which will not be described here again.

FIG. 6 shows a method of manufacturing the array substrate provided in the second embodiment of the present invention. As shown in FIGS. 4 and 6, the method comprises steps of:

depositing a common electrode layer on a substrate 201, and etching the common electrode layer to form a plurality of strip common electrodes 202 arranged in an array;

depositing a gate layer 203 on the substrate 201 formed with the common electrodes 202, and etching the gate layer 203 to form a gate line 2031 between upper and lower rows of pixel units, a common electrode signal line 2032 located in a horizontal direction above the common electrode 202 for a row of pixel units, a first through-hole region 2033 located leftward below each common electrode 202, and a common electrode connection line 2034 between the common electrode signal line 2032 located above one common electrode 202 and the first through-hole region 2033 located leftward below the same one common electrode 202; wherein the common electrode signal line 2032 and the gate line 2031 extend in the same direction, and the common electrode connection line 2034, the common electrode signal line 2032 and the common electrode 202 are electrically connected to one another;

depositing an insulating layer after etching the gate layer, and depositing in order on the insulating layer and etching a layer of active material and source-drain electrodes 204, and a passivation layer 205 so as to form a plurality of drive thin film transistors, data lines 2044, first through-holes 2051, second through-holes 2052 and third through-holes 2053; wherein the drive transistor comprises an active channel 2041, a TFT source electrode 2042 and a drain electrode 2043, and the data lines 2044 are arranged to intersect the gate lines 2031 and are connected with ones of the source electrodes 2042 and the drain electrodes 2043 of the drive transistors;

depositing a conductive layer on the passivation layer 205, and etching the conductive layer to form a first layer of jumper, the first layer of jumper being located between the first through-hole 2051 and the second through-hole 2052, and connecting the first through-hole region 2033 and the common electrode signal line 2032 via the first through-hole 2051 and the second through-hole 2052; and depositing and etching a pixel electrode layer 206 to form a plurality of pixel electrodes 2061 and a second layer of jumper. The second layer of jumper is completely overlapped with the first layer of jumper so as to form the double-layer jumper 301. The pixel electrode 2061 is connected with the other one of the source electrode 2042 and the drain electrode 2043 of the drive thin film transistor.

The plurality of drive transistors, the plurality of pixel electrodes 2061 and the plurality of common electrode 202 compose a plurality of pixels, and the common electrode connection lines 2034 extend in the direction of the data lines 2044.

The abovementioned method is used to manufacture the liquid crystal display screen provided in the second embodiment, and corresponds to the liquid crystal display screen provided in the first embodiment in detail, which will not be described here again.

In each pixel unit of the array substrate provided by embodiments of the present invention, the upper common electrode signal line is connected, through the gate layer, with the through-hole region electrically connected with the lower common electrode signal line, so that the resistance value between upper and lower pixel units is reduced. Further, in each pixel unit of the liquid crystal display screen provided by embodiments of the present invention, a conductive layer is added within a region of the jumper between the through-hole region electrically connected with the lower common electrode signal line and the lower common electrode signal line, so as to further reduce the resistance value between the upper and lower common electrode signal lines. For the liquid crystal display screen of any sizes, due to reducing of the resistance value between upper and lower pixel units, a voltage of the common electrode located far away from the external common electrode signal, after affection by the gate lines and the data lines, can be supplemented in time, and thus can be restored to a normal common electrode voltage, no deflection voltage is easily generated to deflect the pixel liquid crystals, reducing the phenomenon of partial green picture in the liquid crystal display screen as a whole. The array substrate provided by the first embodiment of the present invention is especially suitable for these small and medium sized liquid crystal display screens, while the array substrate provided by the second embodiment is especially suitable for these medium and large sized liquid crystal display screens.

Purposes, technical solutions and advantageous effects of the present invention have been further illustrated in the above specific embodiments. It should be understood that the above description is merely used to illustrate specific embodiments of the present invention, but not to limit the present invention. All of changes, equivalent alternatives, improvements, made within principles and spirit of the disclosure, should be included within the scope of the present invention.

What is claimed is:

1. An array substrate, comprising:

gate lines, data lines arranged to intersect the gate lines, common electrode signal lines, and a plurality of pixels units defined by the gate lines and the data lines, wherein each pixel unit comprises a drive transistor, a pixel electrode connected with one of a source electrode and a drain electrode of the drive transistor while the other one of the source electrode and the drain electrode of the drive transistor is connected with a respective data line, and a common electrode electrically connected with a respective common electrode signal line, the common electrode signal lines and the gate lines being formed in the same layer and the common electrode signal lines extending in the same direction as the gate lines, wherein each pixel unit further comprises a common electrode connection line formed in the same layer as the respective common electrode signal line and extending in a direction of the respective data line, and the common electrode connection line is electrically connected with the respective common electrode signal line and the respective common electrode which are located within the same pixel unit as the common electrode connection line.

2. The array substrate according to claim 1, wherein the common electrode connection line for a pixel unit is connected, via a through-hole and a jumper, to the common electrode signal line for a next row of pixel units.

3. The array substrate according to claim 2, wherein the jumper and the pixel electrode are formed of the same material in the same layer.

4. The array substrate according to claim 2, wherein the jumper is formed by stacking an auxiliary conductive layer and a layer where the pixel electrode is located.

5. The array substrate according to claim 1, wherein the gate lines are made of metal materials or metal compound materials.

6. The array substrate according to claim 5, wherein the gate lines are made of one of or any combination of neodymium aluminum, aluminum, copper, molybdenum, tungsten molybdenum and chromium.

7. The array substrate according to claim 1, wherein the common electrode and the pixel electrode layer are made of one of indium zinc oxide and indium tin oxide or a combination of indium zinc oxide and indium tin oxide.

8. The array substrate according to claim 4, wherein the auxiliary conductive layer is a metal layer, or a conductive layer of low resistivity.

9. A liquid crystal display screen comprising the array substrate according to claim 1.

10. A method of manufacturing an array substrate, the method comprising:

forming a plurality of common electrodes on a substrate;

depositing a gate layer on the substrate formed with the common electrodes, and etching the gate layer to form a gate pattern, wherein the gate pattern comprises gate lines, common electrode signal lines and common electrode connection lines, wherein the common electrode signal lines and the gate lines extend in the same direction; and depositing in order and correspondingly etching an active layer, a source-drain electrode layer, a passivation layer and a pixel electrode layer so as to form a plurality of drive transistors, data lines intersecting the gate lines, and a plurality of pixel electrodes each of which is connected with one of a source electrode and a drain electrode of the respective drive transistor, the other one of the source electrode and the drain electrode of the drive transistor being connected with the respective data line;

wherein the plurality of drive transistors, the plurality of pixel electrodes and the plurality of common electrodes compose a plurality of pixel units, and the common electrode connection lines extend in a direction of the data lines and is electrically connected with the respective common electrode signal line and the respective common electrode which are located within the same pixel unit as the common electrode connection line.

11. A method of manufacturing an array substrate, the method comprising:

forming common electrodes on a substrate;

depositing a gate layer on the substrate formed with the common electrodes, and etching the gate layer to form a gate pattern, wherein the gate pattern comprises gate lines, common electrode signal lines, a through-hole region and common electrode connection lines, wherein the common electrode signal lines and the gate lines extend in the same direction, and the common electrode connection lines, the common electrode signal lines and the common electrodes are electrically connected with one another;

depositing in order and correspondingly etching an active layer, a source-drain electrode layer and a passivation layer so as to form a plurality of drive transistors and data lines intersecting the gate lines, one of a source electrode and a drain electrode of each drive transistor being connected with the respective data line;

depositing and etching a conductive layer to form a first layer of a jumper; and depositing and etching a pixel electrode layer to form a pixel electrode layer pattern, wherein the pixel electrode layer pattern comprises a second layer of the jumper completely overlapped with the first layer of the jumper, and a plurality of pixel electrodes each of which is connected with the other one of the source electrode and the drain electrode of the respective drive transistor;

wherein the plurality of drive transistors, the plurality of pixel electrodes and the plurality of common electrodes compose a plurality of pixel units, and the common electrode connection lines extend in a direction of the data lines; and wherein the first layer of the jumper connects the through hole region and a common electrode signal line corresponding to a next row of pixel units.

* * * * *